United States Patent
Halliyal et al.

(10) Patent No.: US 7,115,469 B1
(45) Date of Patent: Oct. 3, 2006

(54) INTEGRATED ONO PROCESSING FOR SEMICONDUCTOR DEVICES USING IN-SITU STEAM GENERATION (ISSG) PROCESS

(75) Inventors: Arvind Halliyal, Cupertino, CA (US); Mark T. Ramsbey, Sunnyvale, CA (US); Hidehiko Shiraiwa, San Jose, CA (US); Jean Y. Yang, Sunnyvale, CA (US)

(73) Assignee: Spansion, LLC, Sunnyvale, CA (US)

( * ) Notice: Subject to any disclaimer, the term of this patent is extended or adjusted under 35 U.S.C. 154(b) by 286 days.

(21) Appl. No.: 10/754,948

(22) Filed: Jan. 8, 2004

Related U.S. Application Data

(62) Division of application No. 10/023,548, filed on Dec. 17, 2001, now abandoned.

(51) Int. Cl.
*H01L 21/336* (2006.01)

(52) U.S. Cl. .............. 438/257; 438/261; 438/770

(58) Field of Classification Search ........... 438/257, 438/261, 263, 264, 770, 773
See application file for complete search history.

(56) References Cited

U.S. PATENT DOCUMENTS

| | | | | |
|---|---|---|---|---|
| 4,918,503 | A | 4/1990 | Okuyama | 257/301 |
| 5,434,109 | A | 7/1995 | Geissler et al. | 437/239 |
| 5,953,254 | A | 9/1999 | Pourkeramati | 257/321 |
| 6,058,045 | A | 5/2000 | Pourkeramati | 365/185.17 |
| 6,114,258 | A | 9/2000 | Miner et al. | 438/787 |
| 6,153,470 | A * | 11/2000 | He et al. | 438/257 |
| 6,180,538 | B1 | 1/2001 | Halliyal et al. | 438/769 |
| 6,184,155 | B1 | 2/2001 | Yu et al. | 438/763 |
| 6,218,227 | B1 | 4/2001 | Park et al. | 438/216 |
| 6,248,628 | B1 | 6/2001 | Halliyal et al. | 438/257 |
| 6,265,268 | B1 | 7/2001 | Halliyal et al. | 438/261 |
| 6,271,054 | B1 | 8/2001 | Ballantine et al. | 427/534 |
| 6,297,173 | B1 | 10/2001 | Tobin et al. | 438/778 |
| 6,319,775 | B1 | 11/2001 | Halliyal et al. | 438/261 |
| 6,348,380 | B1 * | 2/2002 | Weimer et al. | 438/257 |
| 6,495,475 | B1 * | 12/2002 | Good et al. | 438/773 |
| 2001/0012667 | A1 | 8/2001 | Ma et al. | 438/287 |
| 2002/0172756 | A1 * | 11/2002 | Joo et al. | 427/96 |

OTHER PUBLICATIONS

Trowbridge et al., "Enhanced Oxidation of Silicon Nitride using In Situ Steam Generation", 199th ECS Conf. vol. 2001-1, Abs. No. 269.*

Bidaud et al., "High Reliable In situ Steam generation Process for 1.5-2.5 nm Gate Oxides", 197th ECS Conf. vol. 200-1, Abs. No. 540.*

Kuppurao et al., "In situ steam generation: A new rapid thermal oxidation technique", Solid State Technology, Jul. 2000, pp. 233, 234, 236, 239.*

* cited by examiner

*Primary Examiner*—Tuan H. Nguyen
(74) *Attorney, Agent, or Firm*—Renner, Otto, Boisselle & Sklar, LLP

(57) ABSTRACT

A process for fabrication of a semiconductor device including an ONO structure as a component of a flash memory device, comprising forming the ONO structure by providing a semiconductor substrate having a silicon surface; forming a first oxide layer on the silicon surface; depositing a silicon nitride layer on the first oxide layer; and forming a top oxide layer on the silicon nitride layer, wherein the top oxide layer is formed by an in-situ steam generation oxidation of a surface of the silicon nitride layer. The semiconductor device may be, e.g., a SONOS two-bit EEPROM device or a floating gate FLASH memory device including an ONO structure.

20 Claims, 3 Drawing Sheets

INTEGRATED ONO PROCESSING FOR SEMICONDUCTOR DEVICES USING IN-SITU STEAM GENERATION (ISSG) PROCESS

CROSS-REFERENCE TO RELATED APPLICATION

This application is a division of and claims priority under 35 U.S.C. §120 to U.S. application Ser. No. 10/023,548, filed Dec. 17, 2001 now abandoned.

TECHNICAL FIELD

The present invention relates to a process for preparation of a semiconductor device including forming an ONO structure. A portion of the ONO structure is formed by an in-situ steam generation oxidation.

BACKGROUND ART

Non-volatile memory devices are currently in widespread use in electronic components that require the retention of information when electrical power is terminated. Non-volatile memory devices include read-only-memory (ROM), programmable-read-only memory (PROM), erasable-programmable-read-only memory (EPROM), and electrically-erasable-programmable-read-only-memory (EEPROM) devices. EEPROM devices differ from other non-volatile memory devices in that they can be electrically programmed and erased. Flash EEPROM devices are similar to EEPROM devices in that memory cells can be programmed and erased electrically. However, flash EEPROM devices enable the erasing of all memory cells in the device using a single electrical current pulse.

Product development efforts in EEPROM device technology have focused on increasing the programming speed, lowering programming and reading voltages, increasing data retention time, reducing cell erasure times and reducing cell dimensions. One important dielectric material for the fabrication of the EEPROM is an oxide-nitride-oxide (ONO) structure. One EEPROM device that utilizes the ONO structure is a silicon-oxide-nitride-oxide-silicon (SONOS) type cell. A second EEPROM device that utilizes the ONO structure is a floating gate FLASH memory device, in which the ONO structure is formed over the floating gate, typically a polysilicon floating gate.

In SONOS devices, during programming, electrical charge is transferred from the substrate to the silicon nitride layer in the ONO structure. Voltages are applied to the gate and drain creating vertical and lateral electric fields, which accelerate the electrons along the length of the channel. As the electrons move along the channel, some of them gain sufficient energy to jump over the potential barrier of the bottom silicon dioxide layer and become trapped in the silicon nitride layer. Electrons are trapped near the drain region because the electric fields are the strongest near the drain. Reversing the potentials applied to the source and drain will cause electrons to travel along the channel in the opposite direction and be injected into the silicon nitride layer near the source region. Because silicon nitride is not electrically conductive, the charge introduced into the silicon nitride layer tends to remain localized. Accordingly, depending upon the application of voltage potentials, electrical charge can be stored in discrete regions within a single continuous silicon nitride layer.

Non-volatile memory designers have taken advantage of the localized nature of electron storage within a silicon nitride layer and have designed memory circuits that utilize two regions of stored charge within an ONO layer. This type of non-volatile memory device is known as a two-bit EEPROM, which is available under the trademark MIRRORBIT™ from Advanced Micro Devices, Inc., Sunnyvale, Calif. The MIRRORBIT™ two-bit EEPROM is capable of storing twice as much information as a conventional EEPROM in a memory array of equal size. A left and right bit is stored in physically different areas of the silicon nitride layer, near left and right regions of each memory cell. Programming methods are then used that enable two bits to be programmed and read simultaneously. The two-bits of the memory cell can be individually erased by applying suitable erase voltages to the gate and to either the source or drain regions.

A floating gate FLASH device includes a floating gate electrode upon which electrical charge is stored. The floating gate electrode is formed on a tunnel oxide layer which overlies a channel region residing between the source and drain regions in a semiconductor substrate. The floating gate electrode together with the source and drain regions form an enhancement transistor. Typically, the floating gate electrode may be formed of polysilicon.

In a floating gate FLASH device, electrons are transferred to a floating gate electrode through a dielectric layer overlying the channel region of the enhancement transistor. The electron transfer is initiated by either hot electron injection, or by Fowler-Nordheim tunneling. In either electron transfer mechanism, a voltage potential is applied to the floating gate electrode by an overlying control gate electrode. The control gate electrode is capacitively coupled to the floating gate electrode, such that a voltage applied on the control gate electrode is coupled to the floating gate electrode. The floating gate FLASH device is programmed by applying a high positive voltage to the control gate electrode, and a lower positive voltage to the drain region, which transfers electrons from the channel region to the floating gate electrode.

The control gate electrode is separated from the floating gate electrode by an interpoly dielectric layer, typically an oxide-nitride-oxide stack, i.e., an ONO structure or layer. However, as device dimensions continue to be reduced, the electrical thickness of the interpoly dielectric layer between the control gate electrode and the floating gate electrode must be reduced accordingly. Previously, this has been accomplished by scaling down the thickness of the ONO layer. However, as the ONO layer is made physically thinner, leakage currents through the ONO layer may increase, which limits the scaling down of the total physical thickness of the ONO layer.

Some of the improvements in devices can be addressed through development of materials and processes for fabricating the ONO layer. Recently, development efforts have focused on novel processes for fabrication of the ONO layer. While the recent advances in EEPROM technology have enabled memory designers to double the memory capacity of EEPROM arrays using two-bit data storage, numerous challenges exist in the fabrication of material layers within these devices. In particular, the ONO layer must be carefully fabricated to avoid the creation of interface states that could provide charge leakage paths within the ONO layer. Accordingly, advances in ONO fabrication technology are needed to insure proper charge isolation in ONO structures used in MIRRORBIT™ two-bit EEPROM devices and in floating gate FLASH devices.

DISCLOSURE OF INVENTION

The present invention, in one embodiment, relates to a process for fabrication of a semiconductor device including an ONO structure, including forming the ONO structure by providing a semiconductor substrate having a silicon surface; forming a first oxide layer on the silicon surface; depositing a silicon nitride layer on the first oxide layer; and forming a top oxide layer on the silicon nitride layer, wherein the top oxide layer is formed by an in-situ steam generation (ISSG) oxidation of a surface of the silicon nitride layer.

In another embodiment, the present invention relates to a process for fabrication of a two-bit EEPROM device including an ONO structure, including forming the ONO structure by providing a semiconductor substrate having a silicon surface; forming a first or tunnel oxide layer overlying the silicon surface; depositing a silicon nitride layer overlying the tunnel oxide layer; and forming a top oxide layer overlying the silicon nitride layer by ISSG oxidation of a portion of the silicon nitride layer, wherein the top oxide layer is formed by an in-situ steam generation (ISSG) oxidation of a surface of the silicon nitride layer.

In yet another embodiment, the present invention relates to a process for fabrication of a floating gate FLASH device including an ONO structure, including forming the ONO structure by providing a semiconductor substrate having a floating gate electrode; forming a first or bottom oxide layer overlying the floating gate electrode; depositing a silicon nitride layer overlying the bottom oxide layer; and forming a top oxide layer overlying the silicon nitride layer, wherein the top oxide layer is formed by an in-situ steam generation (ISSG) oxidation of a surface of the silicon nitride layer.

Thus, the present invention, by use of an ISSG oxidation of a silicon nitride layer formed in-situ, an ONO layer may be fabricated without creation of interface states coming from contamination which could provide charge leakage paths within the ONO structure. The present invention can be carried out in a cluster tool. The present invention provides advantages such as (1) formation of a cleaner interface, including less carbon; (2) use of ISSG oxidation, which is faster than other oxidations, thus requiring a lower thermal budget; and (3) formation of a sharper nitride/top oxide interface, resulting in fewer interface states that could provide charge leakage paths within the ONO structure. Thus, the present invention provides an advance in ONO fabrication technology, and insures proper charge isolation in ONO structures used in MIRRORBIT™ two-bit EEPROM devices, and insures proper dielectric separation of the control gate electrode from the floating gate electrode in a floating gate FLASH device, while at the same time providing distinct process and economic advantages. Although described in terms of, and particularly applicable to, MIRRORBIT™ two-bit EEPROM devices and floating gate FLASH devices, the present invention is broadly applicable to fabrication of any semiconductor device that includes an ONO structure.

Figure 1:
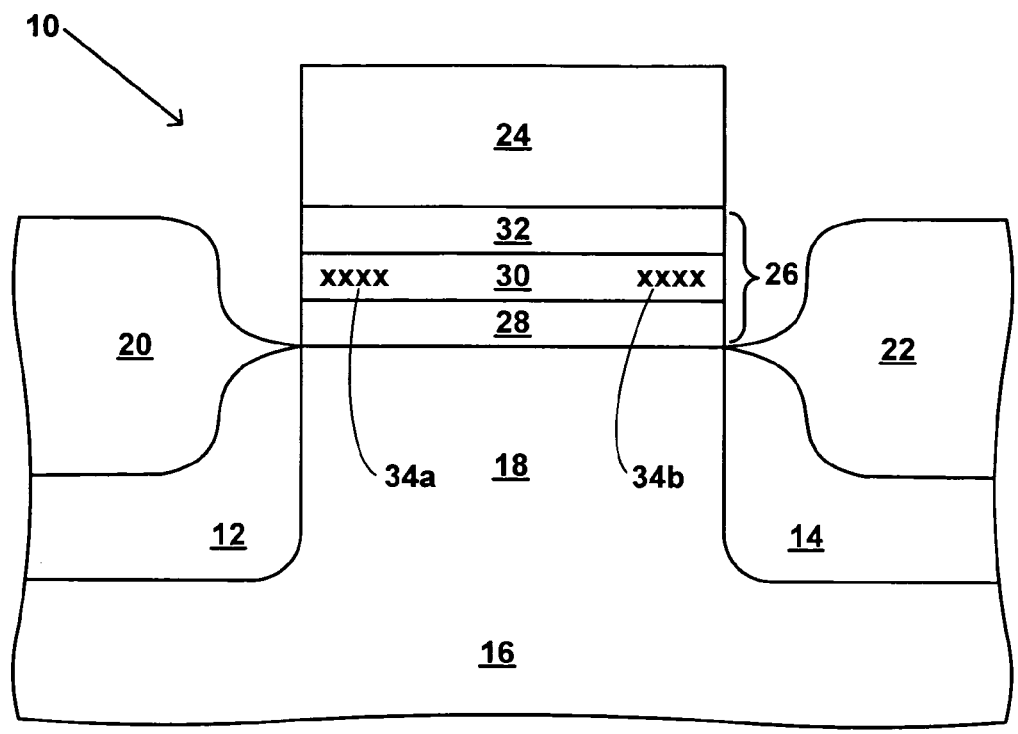
FIG. 1 schematically illustrates, in cross-section, a portion of a semiconductor substrate containing a two-bit EEPROM transistor which incorporates an ONO structure fabricated in accordance with the invention.

It should be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

MODES FOR CARRYING OUT THE INVENTION

Referring first to FIG. 1, there is schematically shown in cross-section a transistor 10 suitable for use in a two-bit EEPROM device, such as the MIRRORBIT™. The transistor 10 includes source/drain regions 12 and 14 located in a semiconductor substrate 16 and separated by a channel region 18. First and second bit line oxide regions 20 and 22 overlie source/drain regions 12 and 14, respectively. A gate electrode 24 overlies the channel region 18 and is separated therefrom by an ONO structure 26. The gate electrode 24 and the ONO structure 26 form a stacked-gate structure. The ONO structure 26 includes a first or tunnel silicon dioxide layer 28, a silicon nitride layer 30 and a top oxide layer 32, in that order as shown in FIG. 1.

Figure 2:
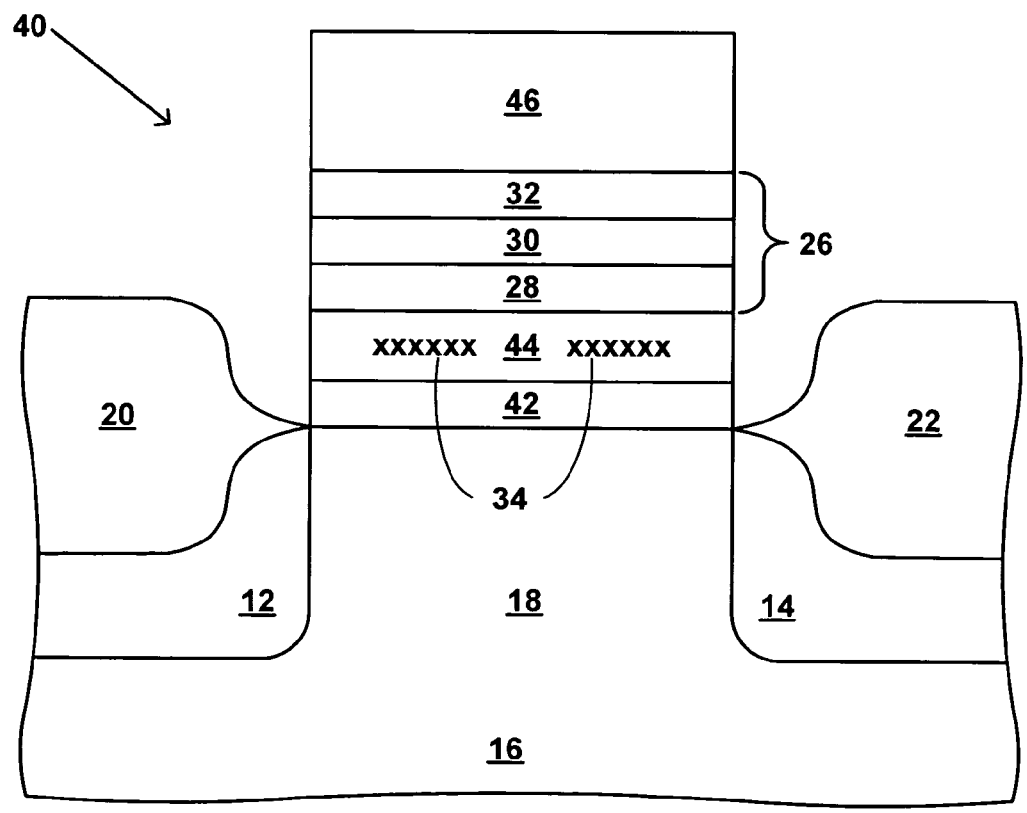
FIG. 2 schematically illustrates, in cross-section, a portion of a semiconductor device containing a floating gate FLASH transistor which incorporates an ONO structure fabricated in accordance with the invention.

Referring next to FIG. 2, there is schematically shown in cross-section a transistor 40 suitable for use in a floating gate FLASH EEPROM device. The transistor 40 includes source/drain regions 12 and 14 located in a semiconductor substrate 16 and separated by a channel region 18. First and second bit line oxide regions 20 and 22 overlie source/drain regions 12 and 14, respectively. A tunnel oxide layer 42 overlies the channel region 18. A floating gate electrode 44 overlies the tunnel oxide layer 42. The floating gate electrode 44 is separated from a control gate electrode 46 by an ONO structure 26. The control gate electrode 46, the ONO structure 26 and the floating gate electrode 44 form a floating gate FLASH memory structure. The ONO structure 26 in FIG. 2 is the same as the ONO structure 26 shown in FIG. 1, except that the first oxide layer 28 may be referred to as a tunnel oxide layer 28.

The following description of the process of the present invention is described in the context of an ONO structure suitable for use in a two-bit EEPROM device, such as the MIRRORBIT™ device. It is to be understood that, while the present invention is discussed herein in that context, that this is merely exemplary and is not intended to limit the scope of the present invention. The ONO structure fabricated by the presently disclosed method is applicable to any semiconductor device in which an ONO structure may be included, and is particularly applicable also to the floating gate FLASH device described above with reference to FIG. 2.

The ONO structure 26 includes a first silicon dioxide layer 28 (tunnel oxide layer in a SONOS device or bottom oxide layer in the floating gate device) overlying the channel region 18. A silicon nitride layer 30 overlies the oxide layer 28. A second silicon dioxide layer (or top oxide layer) 32 overlies the silicon nitride layer 30.

In the operation of the exemplary two-bit EEPROM transistor 10, voltages are applied to the gate electrode 24 and to the source/drain regions 12 and 14. The applied voltages cause electrical charge from the source/drain regions 12 and 14 to propagate across the channel region 18. Once the charge encounters a sufficiently strong vertical field, the charge is either injected or tunnels from the channel region 18 into the silicon nitride layer 30. For example, depending upon the particular voltage levels applied to the control-gate electrode 24 and to the source/drain regions 12 and 14, electrical charges 34a, 34b are transferred into the silicon nitride layer 30 and are localized to regions in proximity to either the source/drain region 12, or the source/drain region 14.

Those skilled in the art will recognize that for proper functioning of a two-bit EEPROM device, the electrical charges 34a, 34b should remain isolated in the regions of the silicon nitride layer 30 to which each is initially introduced. The proper maintenance of the electrical charges 34a, 34b in localized regions of the silicon nitride layer 30 is needed for the proper performance of a two-bit EEPROM device. In particular, the quality of the ONO structure 26 should be such that charge leakage paths are minimized at the interface between the tunnel oxide and top oxide layers 28 and 32, and the silicon nitride layer 30. Additionally, the top oxide layer 32 must be of sufficient density, such that charge trapping sites are minimized within the silicon oxide material.

In the floating gate FLASH device 40, electrons are transferred to the floating gate electrode 44 through the ONO dielectric layer 26 from the channel region 18 of the enhancement transistor. A voltage potential is applied to the floating gate electrode 44 by the overlying control gate electrode 46, which is capacitively coupled to the floating gate electrode 44 through the intervening ONO dielectric layer 26. The floating gate FLASH device 40 is programmed by applying a high positive voltage to the control gate electrode 46, and a lower positive voltage to the drain region 14, which transfers electrons from the channel region 18 to the floating gate electrode 44. The electrons are stored as a charge 34 in the floating gate electrode 44, as shown in FIG. 2.

It will be recognized that for proper operation of the floating gate FLASH device 40, the ONO layer 26 must provide effective dielectric separation between the control gate electrode 46 and the floating gate electrode 44. Any reduction in the thickness of the nitride layer 30 results in a reduction of the overall K value of the ONO layer. Accordingly, formation of the top oxide layer 32 should be conducted so as to avoid excess oxidation of the nitride layer 30.

In accordance with the invention, charge leakage within the ONO structure 26 is minimized by forming a high quality top oxide layer. The reduced charge leakage and improved two-bit EEPROM performance obtained by the present invention can be better understood following a description of an ONO fabrication process carried out in accordance with the invention. In the present invention, the top oxide layer is formed by in-situ steam generation oxidation of the silicon nitride layer, by which, inter alia, a high quality top oxide layer is obtained.

The following description of the present invention follows with reference to FIGS. 3–6. FIG. 7 is a schematic flow diagram showing the steps of the process of the present invention. The following description of the process refers to both FIGS. 3–6 and FIG. 7.

In the first step of the present invention, shown schematically in FIG. 7 as Step S701, a semiconductor substrate is provided. The semiconductor substrate may be any appropriately selected semiconductor substrate known in the art. In one embodiment, the semiconductor substrate is a bulk silicon substrate. In one embodiment, the semiconductor substrate is a silicon-on-insulator semiconductor substrate. In another embodiment, the semiconductor substrate is a p-doped silicon substrate. Suitable semiconductor substrates include, for example, bulk silicon semiconductor substrates, silicon-on-insulator (SOI) semiconductor substrates, silicon-on-sapphire (SOS) semiconductor substrates, and semiconductor substrates formed of other materials known in the art. The present invention is not limited to any particular type of semiconductor substrate.

In a floating gate FLASH device, the semiconductor device provided in the first step of the method comprises not only a silicon substrate 16 but also a tunnel oxide layer 42 and a floating gate electrode 44 which have been formed on the silicon substrate 16. The tunnel oxide layer 42 and the floating gate electrode 46 may be formed appropriately by any process and from any material known in the art. In an embodiment in which the floating gate electrode 44 is formed of polysilicon, it has a silicon surface as described herein. Thus, the following description is applicable generally to a floating gate FLASH device, as well as to the two-bit EEPROM described.

Figure 3:
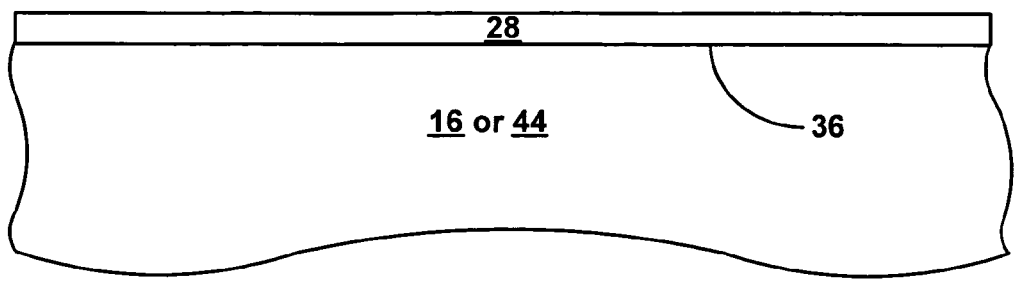
FIGS. 3–6 illustrate, in cross-section, process steps for the fabrication of an ONO structure and a gate structure thereover in accordance with the invention.

Referring to FIG. 3, in the second step of the present invention, shown schematically in FIG. 7 as Step S702, a first oxide layer 28 is formed on an upper silicon surface 36 of the semiconductor substrate 16. In one embodiment, the upper silicon surface is the upper surface of a polysilicon floating gate electrode. In one embodiment, the semiconductor substrate 16 is a single crystal silicon substrate. In one embodiment, the silicon surface 36 previously has been processed to remove contaminants and native oxide. A suitable pre-clean procedure includes cleaning the silicon surface 36 with a dilute solution of hydrofluoric acid or any standard cleaning procedure used in the semiconductor industry. As noted above, in an embodiment in which the semiconductor device includes a two-bit EEPROM device, the first oxide layer 28 may be referred to as the tunnel oxide layer 28, whereas in a floating gate FLASH device, the first oxide layer 28 may be referred to as a bottom oxide layer 28.

In one embodiment, the first oxide layer 28 is formed by in-situ steam generation (ISSG) oxidation of the silicon surface 36 of the semiconductor substrate 16. The ISSG oxidation of the silicon surface 36 may be carried out, for example, in a rapid thermal process (RTP) apparatus. The RTP apparatus may be any such apparatus known in the art. In one embodiment, the RTP apparatus is part of a single-wafer cluster tool.

In one embodiment, the ISSG oxidation of the silicon surface 36 is carried out by placing the wafer in the RTP apparatus and flowing a mixture of oxygen-containing gas and hydrogen-containing gas to the chamber at suitable flow rates and pressure. The temperature of the RTP can be in the range from about 800° C. to about 1150° C. The flow rates and temperature may be suitably selected to provide rapid oxidation of the silicon surface 36, to form an oxide layer of desired thickness.

For the ISSG process described above, any of the commercially available RTP systems can be utilized.

In one embodiment, the hydrogen-containing gas is hydrogen gas, $H_2$. In another embodiment, the hydrogen-containing gas is methane, $CH_4$. In one embodiment, methane is disfavored due to the possible incorporation of carbon into the silicon surface 36. In another embodiment, the hydrogen-containing gas may be ammonia, $NH_3$, but this may be disfavored since it may result in incorporation of nitrogen into the tunnel oxide being formed in the ISSG oxidation.

In one embodiment, the oxygen-containing gas is oxygen gas, $O_2$. In another embodiment, the oxygen-containing gas is nitrous oxide, $N_2O$.

When the hydrogen-containing gas is hydrogen and the oxygen containing gas is oxygen, in one embodiment, the ratio of hydrogen to oxygen is about 2:1, i.e., a substantially stoichiometric ratio. In one embodiment, an increased amount of oxygen is provided, in order to more rapidly drive the ISSG oxidation to completion. Thus, in one embodiment, the ratio of oxygen to hydrogen is in the range from greater than about 2:1 to about 5:1. In another embodiment, the ratio of oxygen to hydrogen is in the range from greater than about 2:1 to about 3:1.

In one embodiment, the absolute pressure in the RTP chamber is in the range from about 50 Torr to about 500 Torr. In another embodiment, the absolute pressure in the RTP chamber is in the range from about 100 Torr to about 300 Torr, and in another embodiment, from about 100 Torr to about 200 Torr, and in another, at about 150 Torr.

With the flows of oxygen-containing gas and hydrogen-containing gas provided to the chamber at a suitable flow rate and pressure and the silicon surface 36 at a temperature of about 500° C., additional heat is applied to the silicon surface 36 to bring it to a temperature in the range of about 800° C. to about 1150° C. In one embodiment, the temperature is in the range from about 900° C. to about 1100° C. When the surface reaches a suitable temperature, it provides an ignition source for reaction of the hydrogen-containing gas and oxygen-containing gas to form water steam, i.e., in-situ generated steam, or ISSG. In one embodiment, as a result of the use of tungsten halogen lights in a light pipe assembly, the ISSG reaction takes place substantially at the surface of the silicon surface 36, since only the surface of the wafer is substantially heated to the foregoing temperatures, as noted above. Formation of the in-situ generated steam at the silicon surface 36 allows greater control over the ISSG oxidation than is available with either other forms of steam oxidation or other oxidations, such as dry oxygen oxidation, or fluorine-enhanced oxidation.

The ISSG oxidation of the silicon surface 36 continues for a period in the range from about 5 seconds to about 500 seconds. In one embodiment, the ISSG oxidation of the silicon surface 36 continues for a period from about 30 to about 120 seconds.

Following completion of the ISSG oxidation reaction, the gas flows of oxygen-containing gas and hydrogen-containing gas are stopped, the temperature of the wafer is reduced, and the chamber is purged with an inert gas, such as nitrogen or argon. In an embodiment in which the ISSG oxidation is carried out in an RTP apparatus which is part of a cluster tool, the wafer need not be fully cooled or removed from the chamber prior to subsequent processing steps.

In one embodiment, the ISSG oxidation is a single-step process. In one embodiment, the silicon surface 36 is directly oxidized under ISSG conditions in a single step, without employing an initial oxidation to form an initial oxide layer, followed by a second oxidation to complete the formation of the oxide layer.

In an alternate embodiment, the first oxide layer 28 may be formed by thermally oxidizing the silicon surface 36 at an elevated temperature in the presence of dry molecular oxygen. In one embodiment, the thermal oxidation is carried out at a temperature in the range of about 900 to about 1100° C. The thermal oxidation process may be carried out in either a batch-type thermal oxidation furnace, or alternatively, in a single-wafer oxidation apparatus. In one embodiment, the thermal oxidation is carried out in the same RTP apparatus as that in which the other steps of the present process are carried out. In one embodiment, the RTP apparatus is part of a single-wafer cluster tool.

In one embodiment, the first oxide layer 28 is formed by a deposition process. In one embodiment, the first oxide layer 28 is formed by an RTCVD process. In one embodiment, the RTCVD deposition is carried out in the same RTP apparatus as that in which the other steps of the present process are carried out. In one embodiment, the RTP apparatus is part of a single-wafer cluster tool. The first oxide can also be formed by depositing the oxide in a batch furnace by an LPCVD process.

In one embodiment, the oxidation forms the first oxide layer 28 having a thickness of about 20 to about 150 angstroms (Å), and in another embodiment, the silicon oxide layer 28 has a thickness of about 100 Å.

Figure 4:
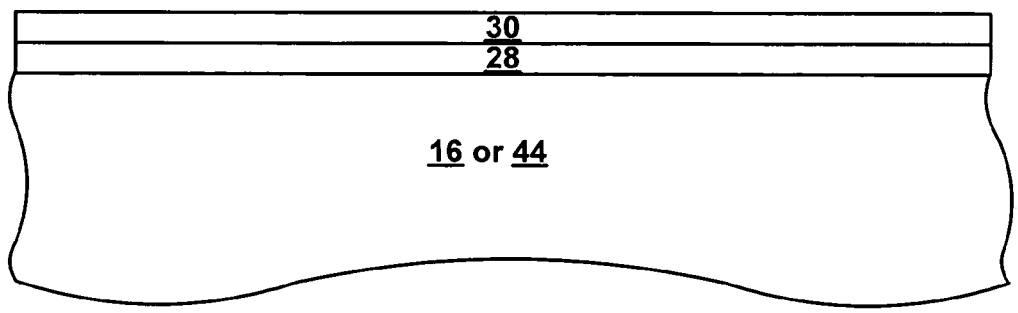

In the third step of the present invention, shown schematically in FIG. 7 as Step S703, a nitride layer 30 is formed on the first oxide layer 28. As shown in FIG. 4, after forming the first oxide layer 28, the silicon nitride layer 30 is deposited on the first oxide layer 28. In one embodiment, the silicon nitride layer 30 is formed by means of a rapid-thermal-chemical-vapor-deposition (RTCVD) process. In one embodiment, the RTCVD process is carried out at a temperature of about 700 to about 800° C. The silicon nitride material may be formed by reacting a suitable nitrogen-containing gas, e.g., ammonia ($NH_3$) with a suitable silicon-containing gas, e.g., dichlorosilane ($SiCl_2H_2$) or silane ($SiH_4$).

In one embodiment, the process is carried out for a period of time and at gas flow rates sufficient to form a silicon nitride layer having a thickness of about 50 to about 200 angstroms. In another embodiment, the process is carried out for a period of time and at gas flow rates sufficient to form a silicon nitride layer having a thickness of about 100 angstroms. The thickness of the silicon nitride layer 30 formed in this step is greater than the desired final thickness of the silicon nitride layer 30 in the ONO stack 26, because a portion of the silicon nitride layer 30 will be converted to silicon dioxide in the following ISSG oxidation step.

In one embodiment, ammonia is introduced in the RTCVD apparatus at a flow rate of about 1 standard liter per minute (slpm) and either dichlorosilane or silane is introduced at a flow rate of about 30 to about 50 standard-cubic-centimeters-per-minute (sccm). The RTCVD process is carried out in three steps including an initial temperature ramp, a deposition step, and cool-down step. In one embodiment, the total reaction time is about 1–3 minutes. In another embodiment, the silicon nitride deposition step is completed in about 2 minutes.

In another embodiment, the silicon nitride layer 30 may be formed by means of a low-pressure-chemical-vapor-deposition (LPCVD) process. In this alternative embodiment, the silicon nitride can be formed in a batch deposition apparatus. In one embodiment, the LPCVD process is carried out at an absolute pressure of about 200 to about 500 millitor (mtorr), at temperatures of about 700–800° C. using ammonia and either dichlorosilane or silane gas.

Figure 5:
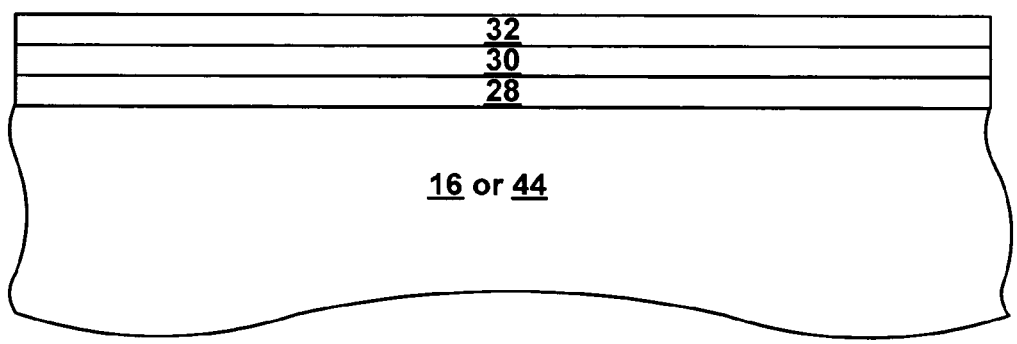

In the fourth step of the present invention, shown schematically in FIG. 7 as Step S704, a top oxide layer 32 is formed on the nitride layer 30 by an ISSG oxidation of the upper surface of the nitride layer 30. As shown in FIG. 5, after depositing the silicon nitride layer 30, the second silicon oxide layer 32, also referred to as a top oxide layer, is formed on the silicon nitride layer 30. In accordance with the invention, the top oxide layer 32 is formed by ISSG oxidation of apart of the upper surface of the silicon nitride layer 30. Thus, the top oxide is formed by a partial oxidation of the nitride layer. In the following description of the ISSG oxidation of the surface of the silicon nitride layer 30, all steps and features not specifically described differently are the same as described above with respect to ISSG oxidation of the silicon surface 36.

In one embodiment, the ISSG oxidation of the surface layer of the silicon nitride layer 30 is carried out in substantially the same way as the above-described ISSG oxidation of the silicon surface 36. In one embodiment, the ISSG oxidation is substantially the same as that described above, except that the ratio of oxygen to hydrogen is increased, relative to that used for oxidation of the silicon surface 36. Thus, in one embodiment, the ratio of oxygen to hydrogen in the ISSG oxidation of the surface layer of the silicon nitride layer is from greater than about 2:1 to about 6:1.

In one embodiment, in which the deposition of the silicon nitride layer 30 is carried out by RTCVD in the RTP apparatus, at the completion of the deposition, when the cool-down step has reduced the temperature to about 400 to about 500° C., the apparatus is converted for an ISSG oxidation process without removing the wafer from the apparatus, and without exposing the wafer to the outside atmosphere. In this embodiment, the apparatus is pumped down to an absolute pressure of about 0.1 Torr to about 1 Torr, and the atmosphere is flushed with an inert gas such as nitrogen or argon, at a gas flow rate sufficient to remove any traces of ammonia and the silicon-containing gas used to form the silicon nitride layer 30. Thereafter, the apparatus is again pumped down to an absolute pressure of about 0.1 Torr to about 1 Torr.

When the chamber is sufficiently evacuated, flows of oxygen-containing gas and hydrogen-containing gas are provided to the chamber at suitable flow rates and pressure. The flow rates may be suitably selected to provide rapid oxidation of the silicon surface 36, without forming an oxide layer deeper than desired.

In one embodiment, heat is applied substantially only to the surface of the wafer in the RTP apparatus by use of a light pipe assembly which directs heat primarily only to the wafer surface. In one embodiment, the light pipe assembly uses tungsten halogen lamps. Use of a light pipe assembly for heating heats primarily only the wafer and allows other parts of the RTP apparatus to remain relatively cool, i.e., at temperatures at least about 400° C. lower than the surface temperature of the silicon surface 36.

In one embodiment, the hydrogen-containing gas is hydrogen gas, $H_2$. In one embodiment, the oxygen-containing gas is oxygen gas, $O_2$. In another embodiment, the oxygen-containing gas is nitrous oxide, $N_2O$.

When the hydrogen-containing gas is hydrogen and the oxygen containing gas is oxygen, in one embodiment, the ratio of hydrogen to oxygen is about 2:1, i.e., a substantially stoichiometric ratio. In one embodiment, an increased amount of oxygen is provided, in order to more rapidly drive the ISSG oxidation to completion. Thus, in one embodiment, the ratio of oxygen to hydrogen is in the range from greater than about 2:1 to about 5:1. In another embodiment, the ratio of oxygen to hydrogen is in the range from greater than about 2:1 to about 3:1.

In one embodiment, the absolute pressure in the RTP chamber is in the range from about 50 Torr to about 500 Torr. In another embodiment, the absolute pressure in the RTP chamber is in the range from about 100 Torr to about 300 Torr, and in another embodiment, from about 100 Torr to about 200 Torr, and in another, at about 150 Torr.

With the flows of oxygen-containing gas and hydrogen-containing gas provided to the chamber at a suitable flow rate and pressure and the surface of the silicon nitride layer 30 at a temperature of about 500° C., additional heat is applied to the silicon nitride surface 30 to bring it to a temperature in the range of about 850° C. to about 1150° C. In one embodiment, the temperature is in the range from about 900° C. to about 1100° C. When the surface of the silicon nitride layer 30 reaches a suitable temperature, it provides an ignition source for reaction of the hydrogen-containing gas and oxygen-containing gas to form water steam, i.e., in-situ generated steam, or ISSG.

The ISSG oxidation of the surface of the silicon nitride layer 30 continues for a period in the range from about 5 seconds to about 500 seconds. In one embodiment, the ISSG oxidation of the surface of the silicon nitride layer 30 continues for a period from about 30 to about 120 seconds.

As a result of the ISSG oxidation of the silicon nitride layer 30, a silicon dioxide layer 32 is formed on the surface of the semiconductor wafer 16. In one embodiment, the ISSG oxidation process is carried out for a period of time and at gas flow rates sufficient to form a silicon dioxide layer 32 having a thickness of about 50 to about 150 angstroms. In another embodiment, the process is carried out for a period of time and at gas flow rates sufficient to form a silicon nitride layer having a thickness of about 100 angstroms.

Following completion of the ISSG oxidation reaction, the gas flows of oxygen-containing gas and hydrogen-containing gas are stopped, the temperature of the wafer is reduced, and the chamber is purged with an inert gas, such as nitrogen or argon. In an embodiment in which the ISSG oxidation is carried out in an RTP apparatus which is part of a cluster tool, the wafer need not be fully cooled or removed from the chamber prior to subsequent processing steps.

The foregoing ISSG oxidation process for the formation of the top oxide layer, and in one embodiment, for the formation of the first oxide layer, advantageously provides an in-situ process for the sequential formation of individual layers within the ONO structure. In particular, in an embodiment in which both the ISSG oxidation to form the first oxide layer 28 and the top oxide layer 32, and the CVD formation of the silicon nitride layer 30 are carried out in a single RTP apparatus, contamination at the silicon nitride/ silicon oxide interface is minimized. This is particularly when these steps are carried out in a single-wafer cluster tool, in a sequential, in-situ deposition sequence. Additionally, uncontrolled native oxidation can be reduced to insure that a single, high-density silicon oxide layer is formed on the silicon nitride layer 30.

In one embodiment, an important feature of the invention includes the sequential formation of the silicon nitride layer 30 and the top oxide layer 32 (the top oxide) in the absence of exposure of the silicon nitride layer 30 to ambient atmosphere. Following the deposition of the silicon nitride layer 30 onto the first oxide layer 28, the wafer substrate 16 is subjected to an ISSG oxidation in the same chamber, without the necessity of being transferred to a separate oxide deposition chamber, which would entail either maintenance of vacuum conditions without exposing the substrate to ambient atmosphere, or application of a positive-pressure inert gas atmosphere during wafer transfer. Thus, the present invention provides distinct process and economic advantages in application of an ISSG oxidation to a silicon nitride layer formed in-situ.

Figure 6:
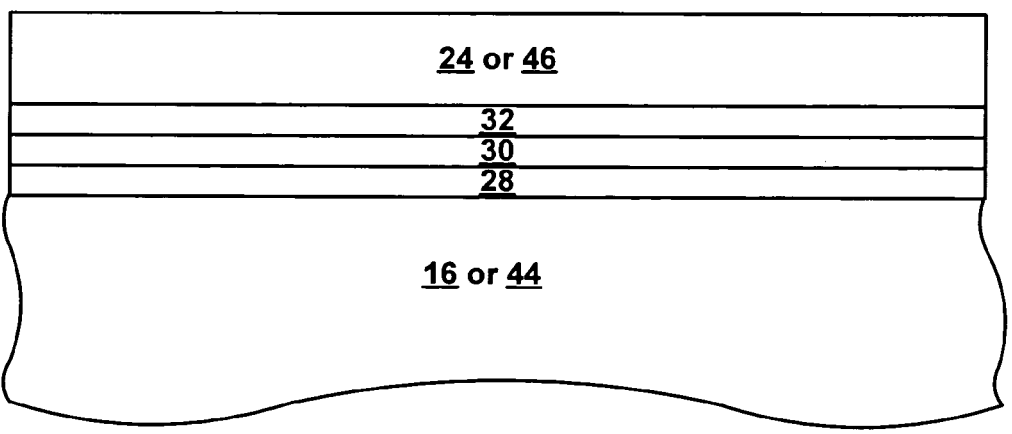
Figure 7:
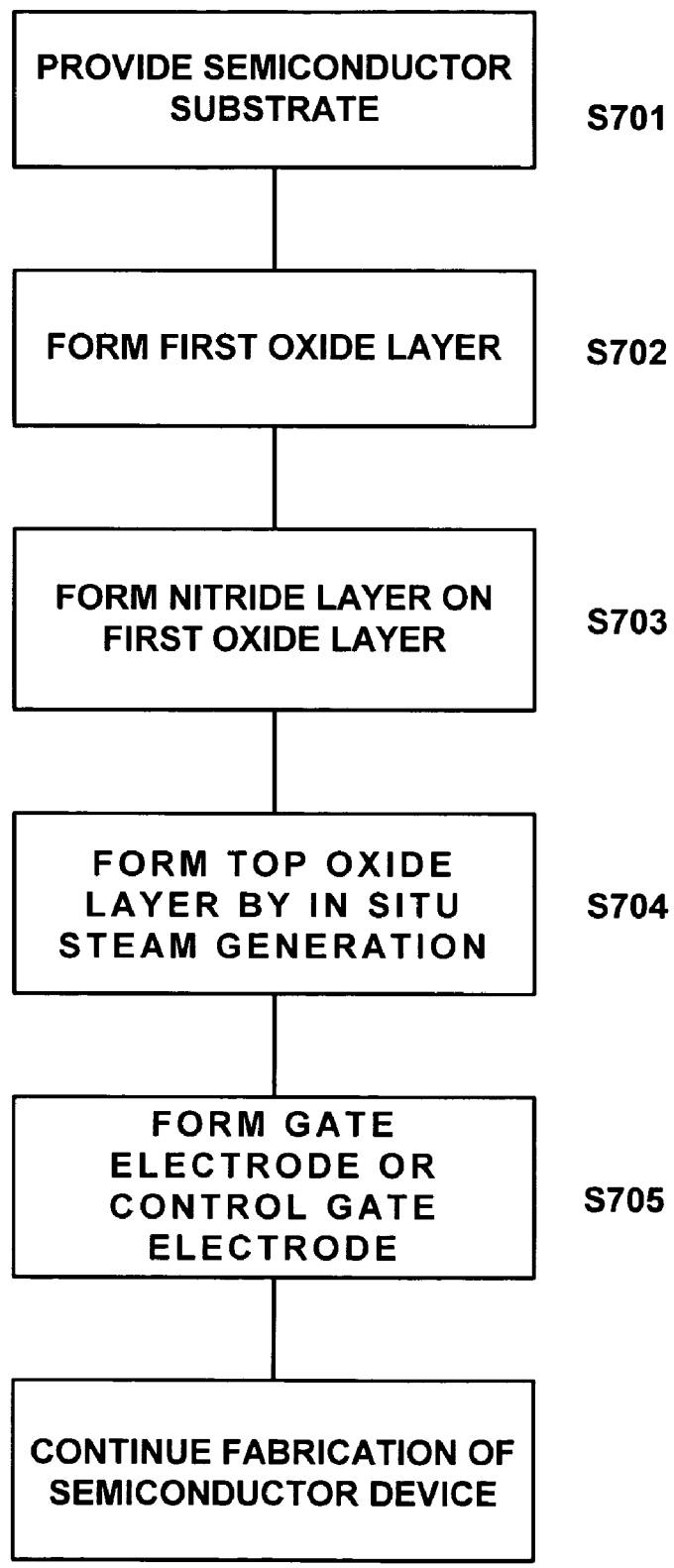
FIG. 7 is a schematic flow diagram showing the steps of the present invention.

As shown in FIG. 6, following formation of the ONO structure 26 in accordance with the present invention, shown schematically in FIG. 7 as Step S705, a layer forming a gate electrode 24 is formed on the top oxide layer 32. In the case of the floating gate FLASH device, a control gate electrode 46 is formed on the top oxide layer 32. The stacked-gate structures shown in FIGS. 1 and 2 are completed by depositing a layer of gate forming material overlying the top oxide layer 32. A lithographic patterning and etching process may then be carried out to define the gate electrode 24 (or control gate electrode 46) and the ONO structure 26. Those skilled in the art will recognize that various gate-forming materials can be used to fabricate the gate electrode 24. For example, the gate electrode 24 and the control gate electrode 46 can be formed with polycrystalline silicon, amorphous silicon, a refractory metal silicide, a metal, and the like.

Following formation of the gate electrode 24, or the control gate electrode 46, as appropriate, and the ONO structure 26, fabrication of the semiconductor device continues, as indicated in the final step of FIG. 7.

There has been disclosed in accordance with the invention a process for fabricating an ONO floating-gate electrode in a MIRRORBIT™ two-bit EEPROM device that fully provides the advantages set forth above. As noted above, the process of the invention is directly applicable to a floating gate FLASH device.

INDUSTRIAL APPLICABILITY

Thus, the present invention, by use of an ISSG oxidation of a silicon nitride layer formed in-situ, a semiconductor device including an ONO structure may be fabricated without creation of interface states that could provide charge leakage paths within the ONO structure. The present invention can be carried out in a cluster tool. The present invention provides advantages such as (1) formation of a cleaner interface, including less carbon; (2) use of ISSG oxidation, which is faster than other oxidations, thus requiring a lower thermal budget; and (3) formation of a sharper nitride/top oxide interface, resulting in fewer interface states that could provide charge leakage paths within the ONO structure. Thus, the present invention provides an advance in ONO fabrication technology, and insures proper charge isolation in ONO structures used in MIRRORBIT™ two-bit EEPROM devices, and insures proper dielectric separation of the control gate electrode from the floating gate electrode in floating gate FLASH devices, while at the same time providing distinct process and economic advantages. Although described in terms of, and particularly applicable to, two-bit EEPROM devices, the present invention is broadly applicable to fabrication of any semiconductor device including an ONO structure.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, the thicknesses of the individual layers making up the ONO structure can be varied from that described herein. It is therefore intended to include within the invention all such variations and modifications that fall within the scope of the appended claims and equivalents thereof.

What is claimed is:

1. A process for fabrication of a semiconductor device including an ONO structure as a component of a flash memory device, comprising forming the ONO structure by:
   providing a semiconductor substrate having a silicon surface;
   forming a first oxide layer on the silicon surface;
   depositing a silicon nitride layer on the first oxide layer; and
   forming a top oxide layer on the silicon nitride layer,
   wherein the top oxide layer is formed by an in-situ steam generation oxidation of a surface of the silicon nitride layer at an absolute pressure in the range from about 50 to about 500 torr.

2. The process of claim 1, wherein the flash memory device comprises a two-bit EEPROM device or a floating gate FLASH device.

3. The process of claim 2, wherein the flash memory device is a two-bit EEPROM device in which the first oxide layer is a tunnel oxide layer, and the tunnel oxide layer is formed by an in-situ steam generation oxidation of the silicon surface.

4. The process of claim 2, wherein the flash memory device is a floating gate FLASH device in which the first oxide layer is a bottom oxide layer, and the bottom oxide layer is formed by an in-situ steam generation oxidation of the silicon surface.

5. The process of claim 1, wherein the steps of forming a first oxide layer, depositing a silicon nitride layer and forming a top oxide layer are carried out in an RTP and RTCVD apparatus or in a single-wafer cluster tool.

6. The process of claim 1, wherein the step of forming a first oxide layer is carried out by an in-situ steam generation oxidation of the silicon surface.

7. The process of claim 1, wherein each step of in-situ steam generation oxidation is carried out by providing a hydrogen-containing gas and an oxygen-containing gas to an RTP system or to a single-wafer cluster tool.

8. The process of claim 1, wherein the in-situ steam generation oxidation is carried out at a temperature in the range from about 850° C. to about 1150° C.

9. The process of claim 1, wherein the step of depositing a silicon nitride layer comprises RTCVD using about 0.5 to 2 slpm ammonia and about 20 to about 50 sccm of a second gas selected from the group consisting of silane and dichlorosilane.

10. The process of claim 9, wherein the RTCVD process comprises a three step sequence including a temperature ramp up step, a deposition step of about 2 minutes, and a cool down step.

11. The process of claim 1, wherein the silicon nitride layer is deposited to a thickness of about 50 to about 300 angstroms.

12. The process of claim 1, wherein the top oxide layer is formed to a thickness of about 50 to about 150 angstroms.

13. A process for fabrication of a semiconductor device, the device including a two-bit EEPROM device including an ONO structure, comprising forming the ONO structure by:
   providing a semiconductor substrate having a silicon surface;
   forming a tunnel oxide layer overlying the silicon surface;
   depositing a silicon nitride layer overlying the tunnel oxide layer; and
   forming a top oxide layer overlying the silicon nitride layer by in-situ steam generation oxidation of a portion of the silicon nitride layer at an absolute pressure in the range from about 50 to about 500 torr.

14. The process of claim 13, wherein the steps of forming a tunnel oxide layer, depositing a silicon nitride layer and forming a top oxide layer are carried out in an RTP apparatus which is a component of a single-wafer cluster tool.

15. The process of claim 12, wherein the step of in-situ steam generation oxidation is carried out at a temperature in the range from about 850° C. to about 1150° C. and by providing hydrogen gas and oxygen gas to the RTP apparatus.

16. The process of claim 13, wherein the step of forming a tunnel oxide layer is carried out by an in-situ steam generation oxidation of the silicon surface.

17. A process for fabrication of a semiconductor device, the device including a floating gate FLASH memory device comprising an ONO structure, comprising forming the ONO structure by:
- providing a semiconductor substrate having a floating gate electrode;
- forming a bottom oxide layer overlying the floating gate electrode;
- depositing a silicon nitride layer overlying the tunnel oxide layer; and
- forming a top oxide layer overlying the silicon nitride layer by in-situ steam generation oxidation of a portion of the silicon nitride layer at an absolute pressure in the range from about 50 to about 500 torr.

18. The process of claim 17, wherein the steps of forming a bottom oxide layer, depositng a silicon nitride layer and forming a top oxide layer are carried out in an RTP apparatus which is a component of a single-wafer cluster tool.

19. The process of claim 17, wherein each step of in-situ steam generation oxidation is carried out at a temperature in the range from about 850° C. to about 1150° C. and by providing hydrogen gas and oxygen gas to the RTP apparatus.

20. The process of claim 17, wherein the step of forming a bottom oxide layer is carried out by an in-situ steam generation oxidation of a portion of the floating gate electrode.

* * * * *

UNITED STATES PATENT AND TRADEMARK OFFICE
CERTIFICATE OF CORRECTION

| | |
|---|---|
| PATENT NO. | : 7,115,469 B1 |
| APPLICATION NO. | : 10/754948 |
| DATED | : October 3, 2006 |
| INVENTOR(S) | : Halliyal et al. |

It is certified that error appears in the above-identified patent and that said Letters Patent is hereby corrected as shown below:

Claim 15, column 12, line 66, replace "claim 12, wherein" with --claim 13, wherein--.

Claim 18, column 14, line 4, replace "layer, depositng a" with --layer, depositing a--.

Claim 19, column 14, line 7, replace "wherein each step" with --wherein the step--.

Claim 20, column 14, line 14, replace "portion of the" with --portion of a surface of the--.

Signed and Sealed this

Second Day of January, 2007

JON W. DUDAS
*Director of the United States Patent and Trademark Office*